(12) United States Patent
Chen

(10) Patent No.: US 7,439,790 B2
(45) Date of Patent: Oct. 21, 2008

(54) LEVEL SHIFTER CIRCUIT

(75) Inventor: Chung-Chun Chen, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 49 days.

(21) Appl. No.: 11/790,198

(22) Filed: Apr. 24, 2007

(65) Prior Publication Data

US 2008/0007316 A1    Jan. 10, 2008

(30) Foreign Application Priority Data

Jul. 4, 2006    (TW) .............................. 95124402 A

(51) Int. Cl.
    *H03L 5/00* (2006.01)
(52) U.S. Cl. ........................................ 327/333; 326/68
(58) Field of Classification Search .................. 326/62, 326/63, 68, 80, 81; 327/333
    See application file for complete search history.

(56) References Cited

U.S. PATENT DOCUMENTS

| 6,307,398 B2 * | 10/2001 | Merritt et al. .................. 326/81 |
| 6,633,192 B2 | 10/2003 | Tsuchiya et al. |
| 6,696,858 B2 | 2/2004 | Tokai et al. |
| 6,741,230 B2 | 5/2004 | Sakai et al. |
| 6,922,095 B2 * | 7/2005 | Chiu .......................... 327/333 |
| 7,362,624 B2 * | 4/2008 | Sun ........................ 365/189.11 |
| 2004/0084696 A1 * | 5/2004 | Chiu .......................... 257/200 |

FOREIGN PATENT DOCUMENTS

| TW | 578379 | 1/2000 |
| TW | 580793 | 3/2004 |

* cited by examiner

*Primary Examiner*—Lincoln Donovan
*Assistant Examiner*—William Hernandez
(74) *Attorney, Agent, or Firm*—Rabin & Berdo, P.C.

(57) ABSTRACT

A level shifter circuit. It comprises a first level shifter unit which comprises a first transistor, a second transistor, a first diode, a first capacitor, a second diode and a second capacitor. The first transistor comprises a first gate, a first source/drain and a second source/drain. The first source/drain is electrically connected to the first voltage. The second transistor comprises a second gate electrically connected to the second source/drain, a third source/drain and a fourth source/drain respectively electrically connected to the first voltage and the first gate. The first diode has a first end electrically connected to the second source/drain and a second end receiving an inverted clock pulse signal. The first and the second capacitors are respectively electrically connected to the first and the second diodes. The second diode has a first end electrically connected to the fourth source/drain and a second end receiving a clock pulse signal.

9 Claims, 8 Drawing Sheets

100

LEVEL SHIFTER CIRCUIT

This application claims the benefit of Taiwan Patent Application Serial No. 95124402, filed Jul. 4, 2006, the subject matter of which is incorporated herein by reference.

BACKGROUND OF THE INVENTION

1. Field of the Invention

The invention relates in general to a level shifter circuit, and more particularly, to a level shifter circuit adopting single type field effect transistor.

2. Description of the Related Art

The low temperature polysilicon (LTPS) liquid crystal display (LCD) being the mainstream of consumer electronic products is mainly applied in highly integrated and high quality displays. Conventionally, the level shifter circuit of a liquid crystal driving circuit uses one or more complementary metal oxide semiconductor (CMOS) field effect transistors. However, the level shifter circuit incorporating CMOS transistor requires more masks and more complicated processing, and therefore the entire costs of LCDs largely increase.

Therefore, how to provide a level shifter circuit whose manufacturing process is effectively simplified and power loss is reduced has become an imminent issue to be resolved.

SUMMARY OF THE INVENTION

It is therefore an object of the invention to provide a level shifter circuit adopting the circuit design of single type metal oxide semiconductor transistor such that both the manufacturing cost of the LCD and the power loss are reduced.

The invention achieves the above-identified object by providing a level shifter circuit comprising a first level shifter unit. The first level shifter unit comprises a first transistor, a second transistor, a first diode, a first capacitor, a second diode and a second capacitor. The first transistor comprises a first gate, a first source/drain and a second source/drain, wherein the first source/drain is electrically connected to the first voltage. The second transistor comprises a second gate, a third source/drain and a fourth source/drain, wherein the second gate is electrically connected to the second source/drain, the third source/drain is electrically connected to the first voltage, and the fourth source/drain is electrically connected to the first gate. A first end of the first diode is electrically connected to the second source/drain. A second end of the first diode receives an inverted clock pulse signal. The first capacitor is electrically connected to the first diode in parallel. A first end of the second diode is electrically connected to the fourth source/drain. A second end of the second diode receives a clock pulse signal. The second capacitor is electrically connected to the second diode in parallel.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
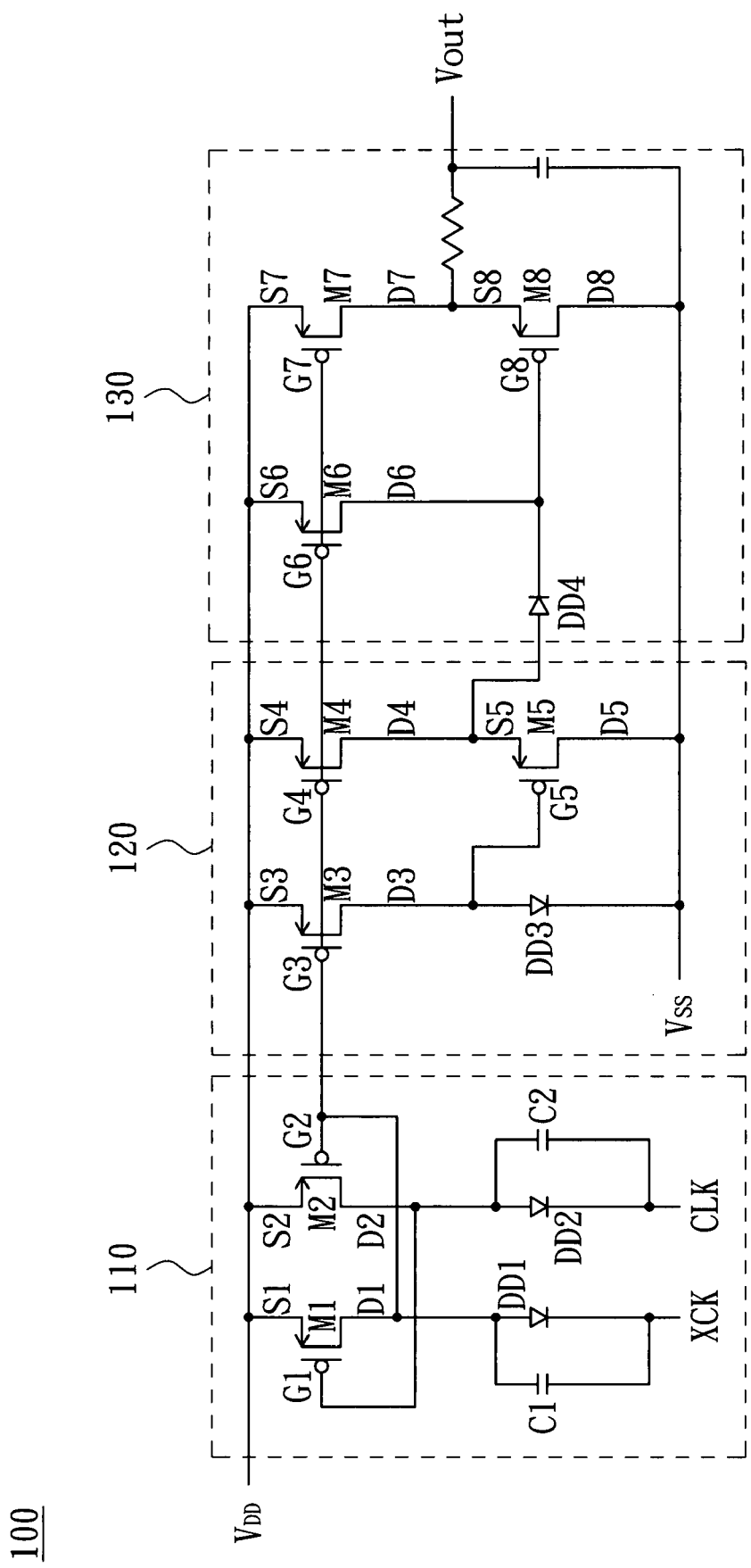
FIG. 1 is a circuit diagram of a level shifter circuit adopting P-type metal oxide semiconductor (PMOS) transistor according to a preferred embodiment of the invention.

Referring to FIG. 1, a circuit diagram of a level shifter circuit adopting P-type metal oxide semiconductor (PMOS) transistor according to a preferred embodiment of the invention is shown. The level shifter circuit 100 is exemplified by the circuit design of PMOS transistor. The level shifter circuit 100 comprises a first level shifter unit 110 and a second level shifter unit 120. The first level shifter unit 110 comprises a first transistor M1, a second transistor M2, a first diode D1, a first capacitor C1, a second diode D2 and a second capacitor C2. The first transistor M1 comprises a first source S1, a first gate G1 and a first drain D1, wherein the first source S1 is electrically connected to the first voltage VDD. The second transistor M2 comprises a second source S2, a second gate G2, a second drain D2, wherein the second gate G2 is electrically connected to the first drain D1, the second source S2 is electrically connected to the first voltage VDD, and the second drain D2 is electrically connected to the first gate G1. One end of the first diode DD1 is electrically connected to the first drain D1, and the other end of the first diode DD1 receives an inverted clock pulse signal XCK. The first capacitor C1 is electrically connected to the first diode DD1 in parallel. One end of the second diode DD2 is electrically connected to the second drain D2, and the other end of the second diode DD2 receives a clock pulse signal CLK. The second capacitor C2 is electrically connected to the second diode DD2 in parallel.

The second level shifter unit 120 comprises a third transistor M3, a third diode D3, a fourth transistor M4 and a fifth transistor M5. The third transistor M3 comprises a third source S3, a third gate G3 and a third drain D3, wherein the third gate G3 is electrically connected to the second gate G2, and the third source S3 is electrically connected to the first voltage VDD. One end of the third diode DD3 is electrically connected to the third drain D3, and the other end of the third diode DD3 is electrically connected to the second voltage VSS. The fourth transistor M4 comprises a fourth source S4, a fourth gate G4 and a fourth drain D4, wherein the fourth gate G4 is electrically connected to the second gate G2, and the fourth source S4 is electrically connected to the first voltage VDD. The fifth transistor M5 comprises a fifth source S5, a fifth gate G5 and a fifth drain D5, wherein the fifth gate G5 is electrically connected to the third drain D3, the fifth source S5 is electrically connected to the fourth drain D4, and the fifth drain D5 is electrically connected to the second voltage VSS.

Preferably, the fifth source S5 outputs a first level adjusted clock pulse signal corresponding to the clock pulse signal CLK.

Furthermore, the level shifter circuit 100 preferably further comprises an output unit 130. The output unit 130 comprises a fourth diode DD4, a sixth transistor M6, a seventh transistor M7, and an eighth transistor M8. One end of the fourth diode DD4 is electrically connected to the fourth drain D4. The sixth transistor M6 comprises a sixth source S6, a sixth gate G6 and a sixth drain D6, wherein the sixth gate G6 is electrically connected to the second gate G2, the sixth source S6 is electrically connected to the first voltage VDD, the sixth drain D6 is electrically connected to the other end of the fourth diode DD4. The seventh transistor M7 comprises a seventh source S7, a seventh gate G7 and a seventh drain D7, wherein the seventh gate G7 is electrically connected to the second gate G2, and the seventh source S7 is electrically connected to the first voltage VDD. The eighth transistor M8 comprises an eighth source S8, and an eighth gate G8 and an eighth drain D8, wherein the eighth gate G8 is electrically connected to the other end of the fourth diode DD4, the eighth source S8 is electrically connected to the seventh drain D7, and the eighth drain D8 is electrically connected to the second voltage VSS. Preferably, the eighth source S8 outputs a second level adjusted clock pulse signal corresponding to the first level adjusted clock pulse signal.

Figure 2:
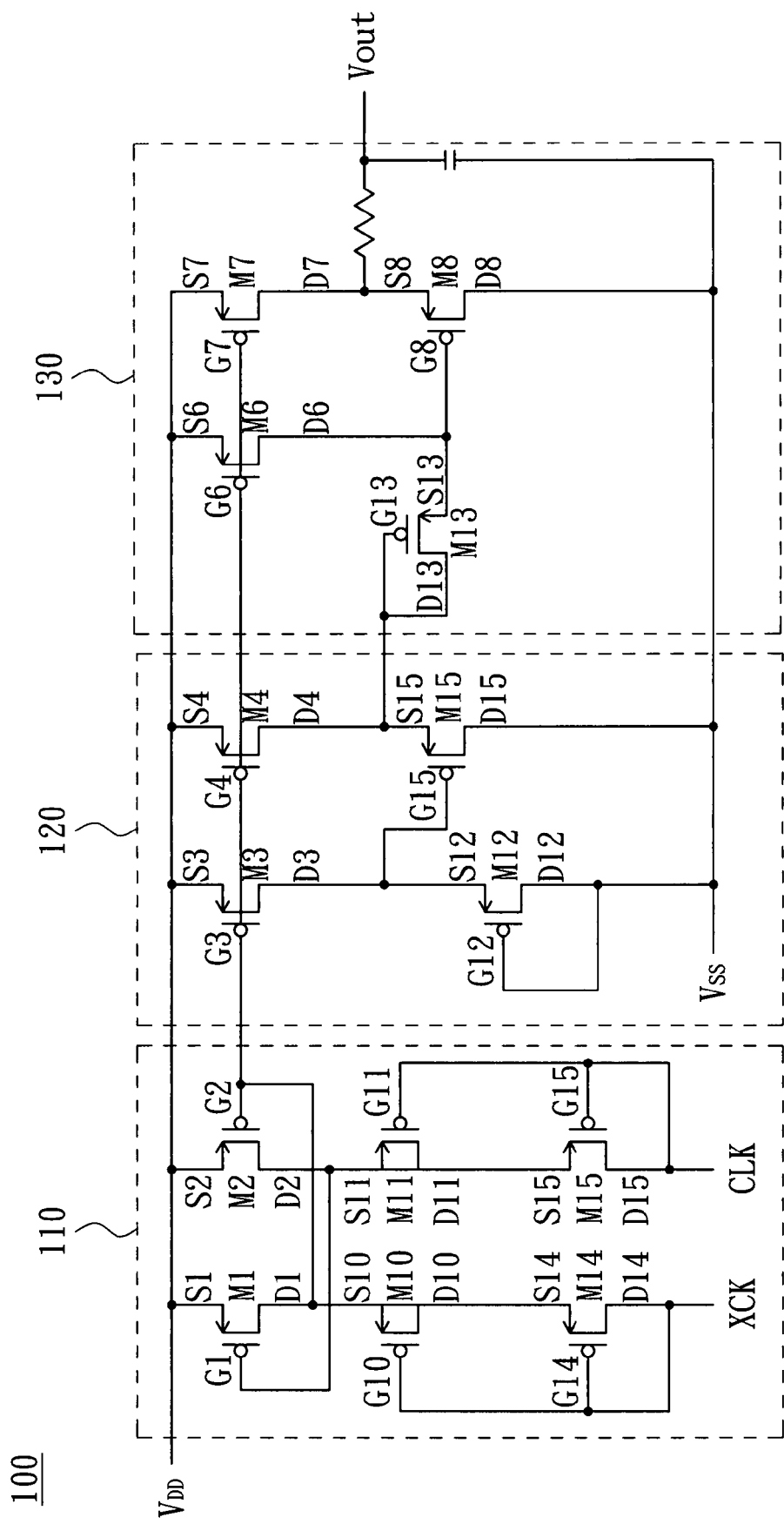
FIG. 2 is a detailed circuit diagram of the level shifter circuit adopting PMOS transistor according to a preferred embodiment of the invention.

Referring to FIG. 2, a detailed circuit diagram of the level shifter circuit adopting PMOS transistor according to a preferred embodiment of the invention is shown. The first diode DD1 to the fourth DD4 are respectively implemented by a tenth transistor M10, an eleventh transistor M11, a twelfth transistor M12 and a thirteenth transistor M13, and the first capacitor C1 and the second capacitor C2 are respectively implemented by a fourteenth transistor M14 and a fifteenth transistor M15. Each gate of the tenth transistor M10 to the thirteenth M13 is electrically connected to the corresponding drain. The drain of the tenth transistor M10 receives an inverted clock pulse signal XCK, the drain of the eleventh transistor M11 receives a clock pulse signal CLK, the drain D12 of the twelfth transistor M12 is electrically connected to the second voltage VSS, the drain D13 of the thirteenth transistor M13 is electrically connected to the fourth drain D4. The sources of the fourteenth transistor M14 and the fifteenth M15 are electrically connected to the corresponding drains. The gate of the fourteenth transistor M14 is electrically connected to the gate of the tenth transistor M10, the gate G15 of the fifteenth transistor M15 is electrically connected to the gate G11 of the eleventh transistor M11.

Figure 3A:
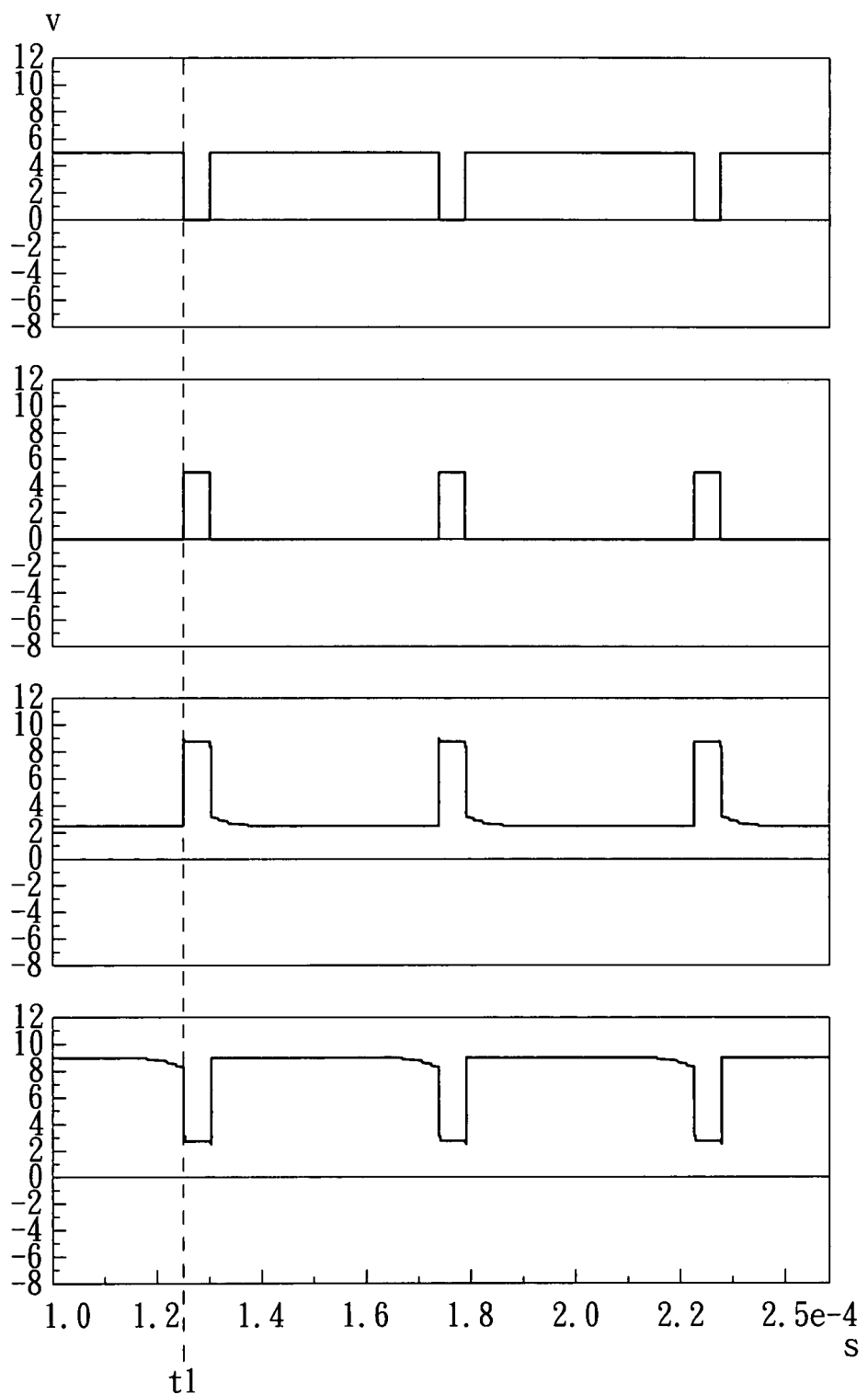
FIG. 3A is a waveform of the simulation result of a clock pulse signal, an inverted clock pulse signal, an output end of a first level shifter unit, and a second node according to a preferred embodiment of the invention.
Figure 3B:
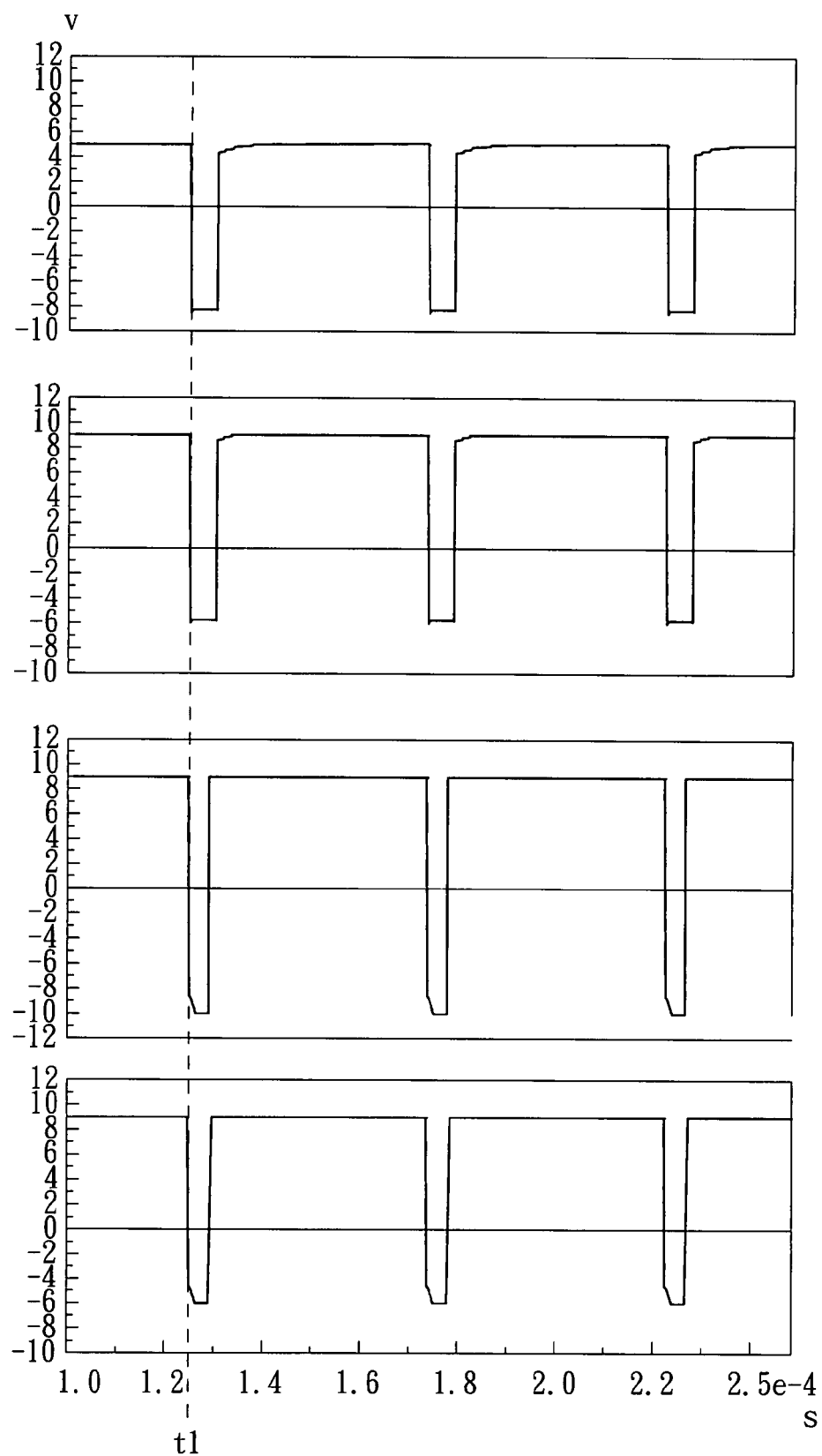
FIG. 3B is a waveform of the simulation result of a third node, an output end of a second level shifter unit, a fifth node, and an output end of an output unit according to a preferred embodiment of the invention.

Referring to FIG. 3A, a waveform of the simulation result of a clock pulse signal CLK, an inverted clock pulse signal XCK, an output end X1 of a first level shifter unit, and a second node X2 according to a preferred embodiment of the invention is shown. Referring to FIG. 3B, a waveform of the simulation result of a third node X3, an output end X4 of a second level shifter unit, a fifth node X5, and an output end Vout of output unit according to a preferred embodiment of the invention is shown. In FIGS. 3A and 3B, the clock pulse signal is switched between 0V and 5V, and the threshold voltages Vth of all transistors are exemplified by being approximately 2.5V. Before time point t1, the clock pulse signal is maintained at a high level voltage of approximately 5V, and the inverted clock pulse signal is maintained at a low level voltage of approximately 0V. Preferably, the first voltage VDD is a high voltage larger than the high level voltage (approximately 5V) of the clock pulse signal CLK. For example, the first voltage VDD is 9V. The second voltage VSS is a voltage lower than the low level voltage (approximately 0V) of the clock pulse signal CLK. For example, second voltage VSS is −6V.

Figure 4A:
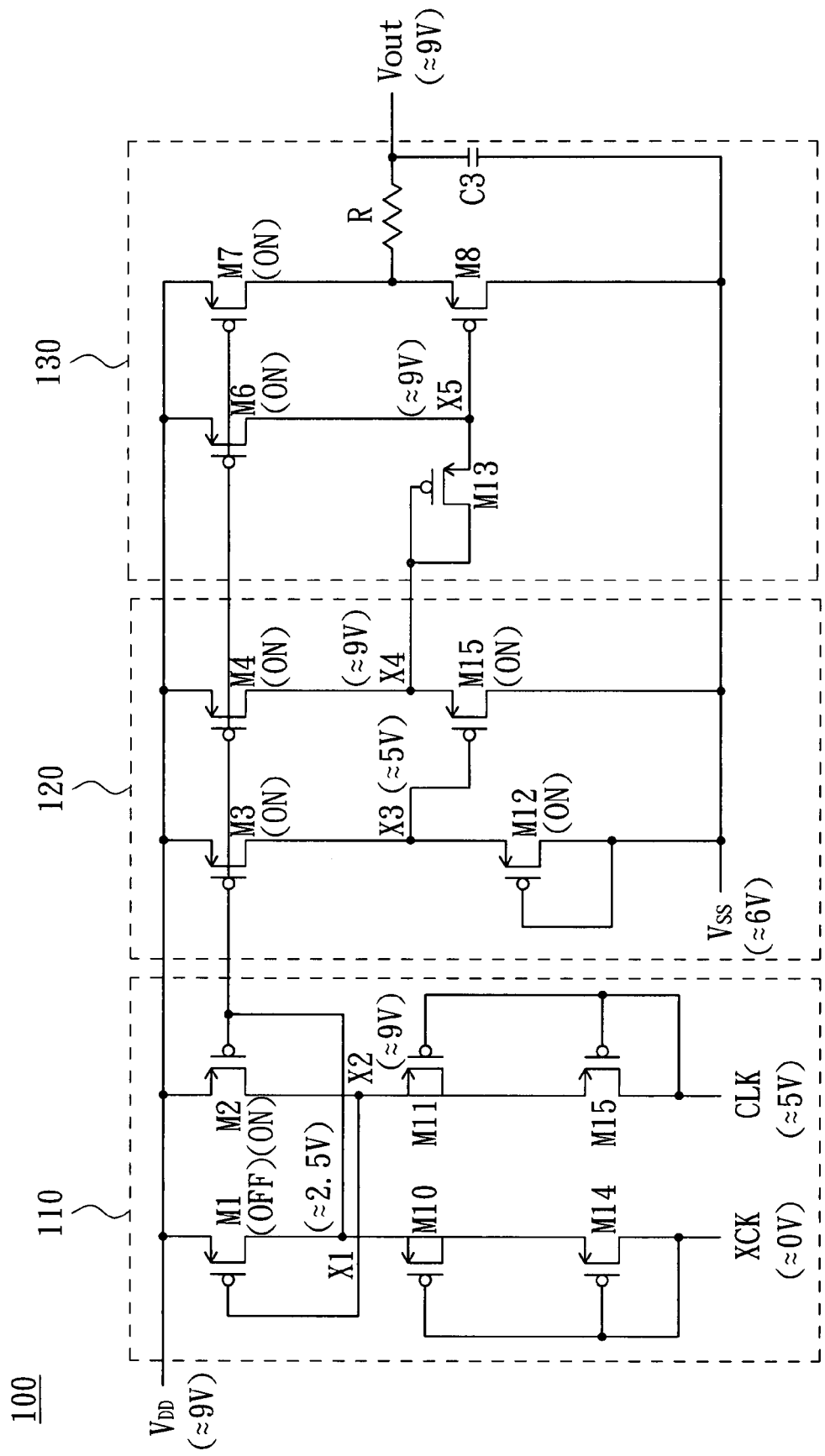
FIG. 4A illustrates the state of each transistor of the level shifter circuit according to a preferred embodiment of the invention before time point t1.

Referring to FIG. 4A, the state of each transistor of the level shifter circuit according to a preferred embodiment of the invention before time point t1 is shown. In the first level shifter unit 110, the eleventh transistor M11 and the fifteenth transistor M15 receive a clock pulse signal CLK whose voltage level is high to increase the voltage of the second node X2 positioned between the second transistor M2 and the eleventh transistor M11 to be substantially equal to the first voltage VDD, which is approximately 9V. The voltage of the second node X2 is outputted to the gate of the first transistor M1 to turn off the first transistor M1. To the contrary, the tenth transistor M10 and the fourteenth transistor M14 receive an inverted clock pulse signal XCK whose voltage level is low to decrease the voltage level of the first node X1 positioned between the first voltage M1 and the tenth transistor M10 to be substantially equal to the threshold voltage (approximately 2.5V) of the transistor. The voltage of the first node X1 is outputted to the gate of the second transistor M2 to turn on the second transistor M2. Afterwards, the third transistor M3, the fourth transistor M4, the sixth transistor M6 and the seventh transistor M7 are turned on accordingly.

Then, in the second level shifter unit 120, the voltage of the third node X3 positioned between the third transistor M3 and the twelfth transistor M12 is affected by the forward-biased diode (the twelfth transistor M12) and is decreased to be substantially lower than the voltage level (approximately 5V) of the first voltage VDD. Since the fourth transistor M4 and the fifth transistor M5 are both turned on, the fourth node X4 positioned between the fourth transistor M4 and the fifth transistor M5 is substantially equal to the first voltage VDD (approximately 9V), and so is the fifth node X5 positioned between the thirteenth transistor M13 and the eighth transistor M8 substantially equal to the first voltage VDD (approximately 9V). The voltage level of the fourth node X4 is the level of the fifth source S5 corresponding to the first level adjusted clock pulse signal which is corresponding to the voltage level of the clock pulse signal CLK. It can be seen from FIG. 3B that the high voltage level of the clock pulse signal CLK is further increased to the voltage level of the first voltage VDD of approximately 9V. Next, the voltage level of the sixth node X6 positioned between the seventh transistor M7 is equal to the level of the eighth transistor M8 corresponding to the adjusted clock pulse signal at the fourth node X4, which is substantially equal to the voltage level of the first voltage VDD of approximately 9V. The voltage level of the sixth node X6 is outputted via a filter circuit composed of a resistor R and a third capacitor C3, and the output voltage Vout is substantially equal to the first voltage VDD of approximately 9V.

Figure 4B:
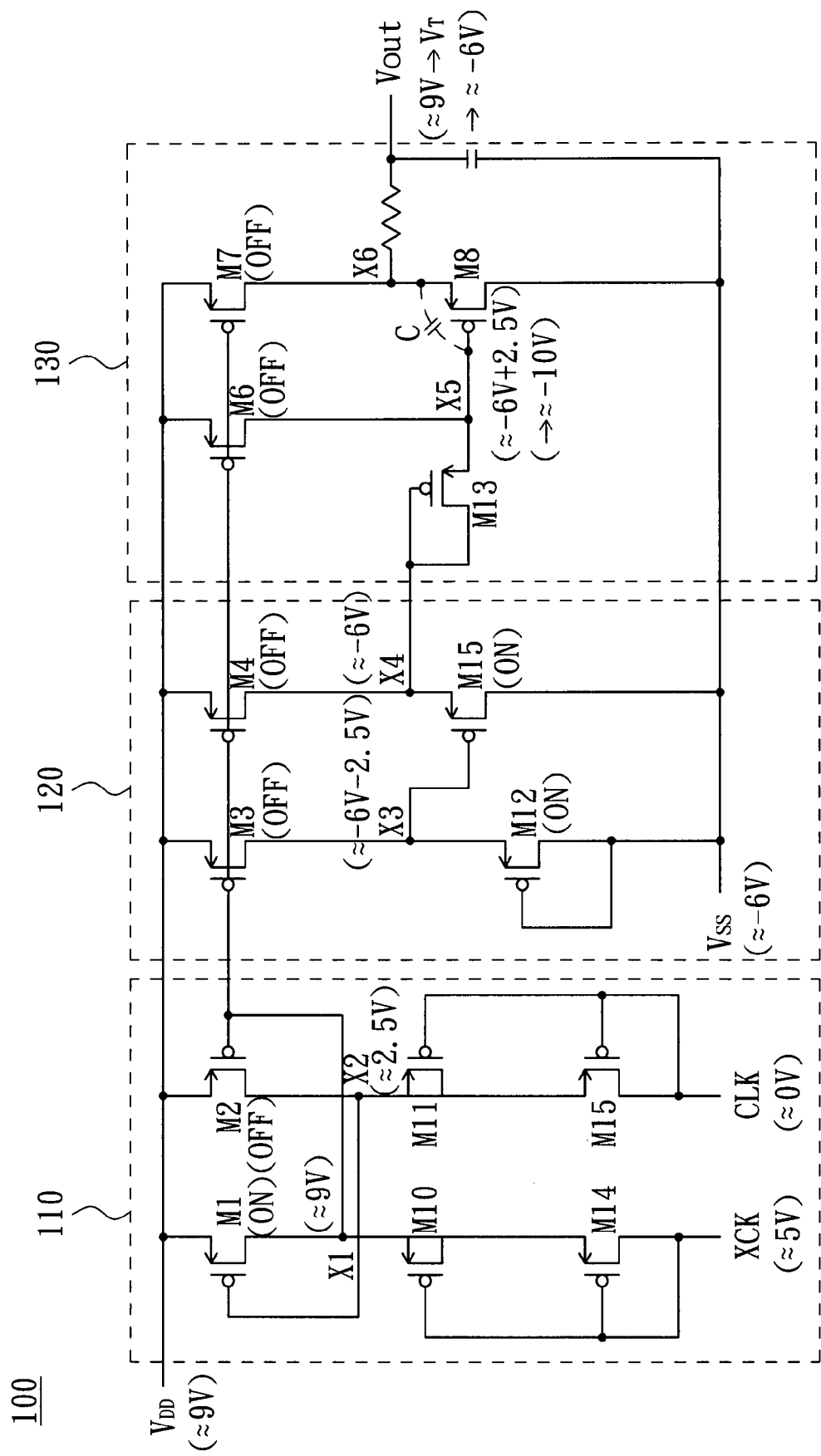
FIG. 4B illustrates the state of each transistor of the level shifter circuit according to a preferred embodiment of the invention after time point t1.

Then, as shown in FIG. 3A, after time point t1, the voltage level of the clock pulse signal CLK is switched from a high level voltage (approximately 5V) to a low level voltage (approximately 0V), and the voltage level of the inverted clock pulse signal is switched from a low level voltage (approximately 0V) to a high level voltage (approximately 5V). Referring to FIG. 4B, the state of each transistor of the level shifter circuit according to a preferred embodiment of the invention after time point t1 is shown. The eleventh transistor M11 and the fifteenth transistor M15 receive a clock pulse signal CLK whose voltage level is low such that the voltage level of the second node X2 is decreased to be substantially equal to the threshold voltage (approximately 2.5V) of the transistor, and the voltage of the second node X2 is outputted to the gate of the first transistor M1 to turn on the first transistor M1. To the contrary, the tenth transistor M10 and the fourteenth transistor M14 receive an inverted clock pulse signal XCK whose voltage level is high such that the voltage level of the first node X1 is increased to be substantially equal to the voltage level of the first voltage VDD of approximately 9V, and the voltage of the first node X1 is outputted to the gate of the second transistor M2 to turn off the second transistor M2. Afterwards, the third transistor M3, the fourth transistor M4, the sixth transistor M6 and the seventh transistor M7 are turned off accordingly.

Then, in the second level shifter unit 120, the twelfth transistor M12 is changed from a forward-biased diode to a backward-biased diode such that the voltage level of the third node X3 is switched to be substantially lower than the second voltage VSS minus the threshold voltage of transistor (i.e. approximately equal to (−6V-2.5V=−8.5V) for turning on the fifth transistor M5 and making the voltage level of the fourth node X4 is substantially equal to the second voltage VSS (approximately −6V). Meanwhile, the voltage level of the fifth node X5 is substantially adjusted to be higher than the second voltage VSS plus the threshold voltage of transistor (approximately −6V+2.5V) via the forward-biased diode (the thirteenth transistor M13) to turn on the eighth transistor M8. The eighth transistor M8, which has been turned on, enables the voltage of the node X6 to be switched to a low voltage VT from the first voltage VDD (approximately 9V). The parasitic capacitor C positioned between the source and the gate of the eighth transistor M8 enables the voltage level of the fifth node X5 to follow the voltage of the node X6 to be switched to a low voltage VT and then decreased to a lower voltage, for example −10V. Meanwhile, the thirteenth transistor M13, which acts as a diode, is reversed biased, such that the node X5 is floating. When the voltage of the fifth node is switched to −10V, due to the voltage of the source and the gate of the eighth transistor M8 is larger than the threshold voltage such that the eighth transistor M8 enters a linear region to be completely turned on, to reduce the output voltage Vout to be almost equal to voltage of the second voltage VSS (approximately −6V). Therefore, the output voltage of the level shifter circuit 100 of the present embodiment of the invention covers a full range, that is, from the first voltage VDD to the second voltage VSS.

Figure 5A:
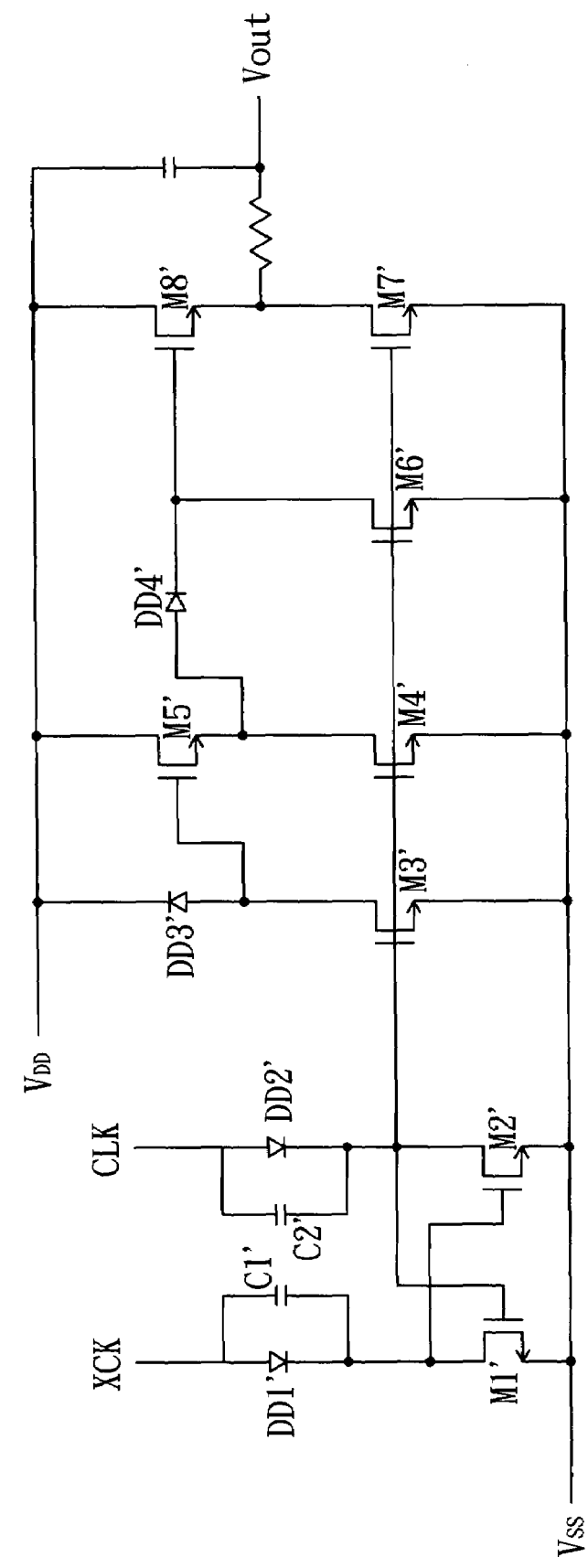
FIG. 5A is a circuit diagram of the level shifter circuit adopting N-type metal oxide semiconductor (PMOS) transistor according to a preferred embodiment of the invention.
Figure 5B:
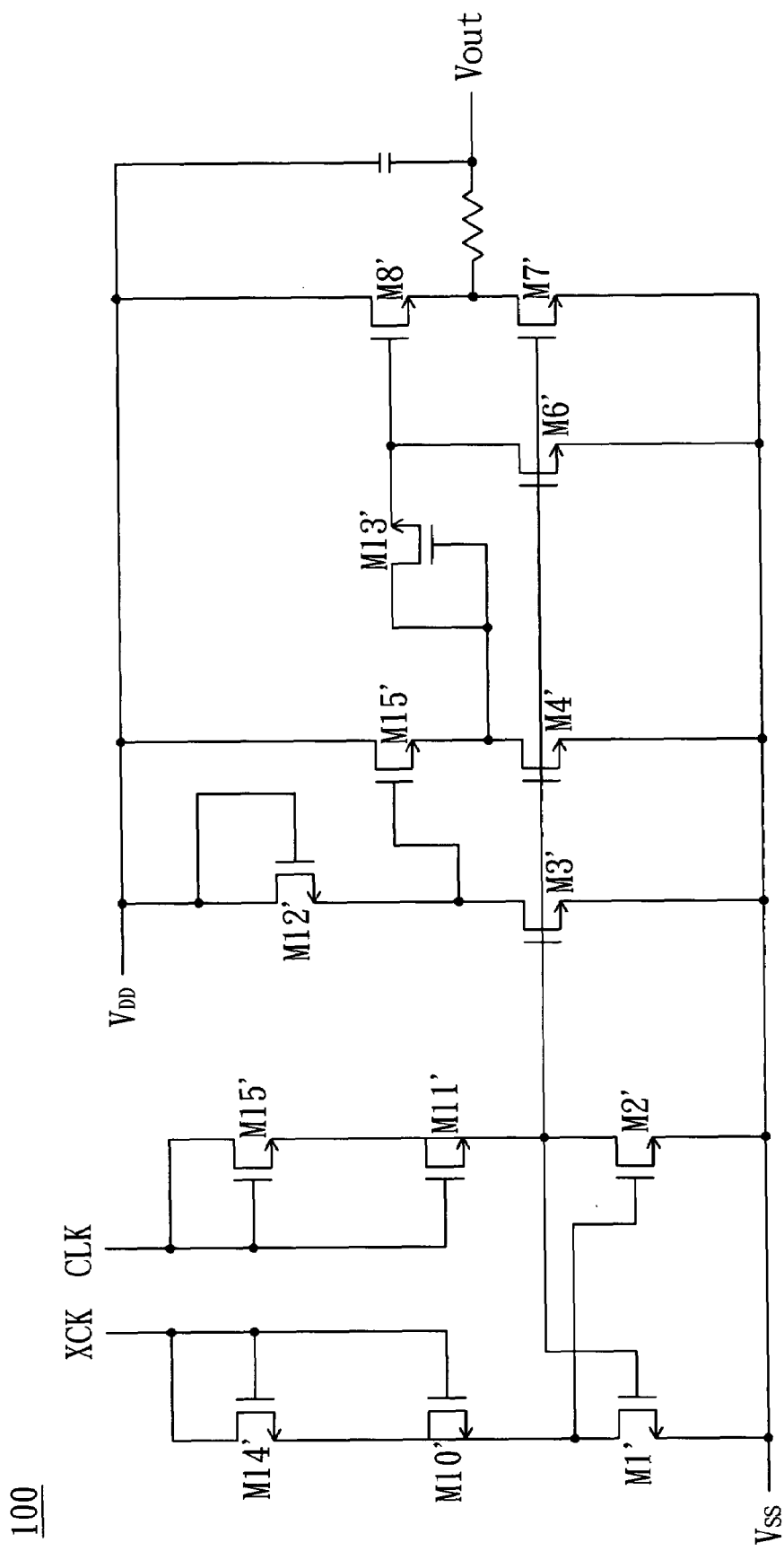
FIG. 5B is a detailed circuit diagram of the level shifter circuit adopting NMOS transistor according to a preferred embodiment of the invention.

Despite the level shifter circuit of the invention is exemplified by the circuit design of a PMOS transistor, the level shifter circuit of the invention can adopt the design of other single type transistor such as NMOS transistor. Referring to FIG. 5A, a circuit diagram of the level shifter circuit adopting an N-type metal oxide semiconductor (PMOS) transistor according to a preferred embodiment of the invention is shown. Referring to FIG. 5B, a detailed circuit diagram of the level shifter circuit adopting an NMOS transistor according to a preferred embodiment of the invention is shown. The detailed circuit design of the level shifter circuit 500 is similar to the above level shifter circuit adopting PMOS design and is not repeated here.

The level shifter circuit disclosed in the above embodiments of the invention adopts the manufacturing process of single type metal oxide semiconductor transistor such as PMOS transistor for instance, not only simplifying the manufacturing process of the driving circuit of the shift register but also reducing power loss and saving the manufacturing cost of LCD. The level shifter circuit of the invention adopting single type metal oxide semiconductor transistor such as a PMOS transistor for instance is particularly suitable to be incorporated in the LTPS LCD using the PMOS manufacturing process for manufacturing the thin film transistor. Besides, the level shifter circuit of the invention is capable of producing a lowest level voltage that a conventional PMOS transistor inverter cannot produce, hence obtaining an enhanced full range of voltage level outputted from the output unit.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A level shifter circuit, comprising:
   a first level shifter unit, comprising:
   a first transistor comprising a first gate, a first source/drain and a second source/drain, wherein the first source/drain is electrically connected to a first voltage;
   a second transistor comprising a second gate, a third source/drain and a fourth source/drain, wherein the second gate is electrically connected to the second source/drain, the third source/drain is electrically connected to the first voltage, and the fourth source/drain is electrically connected to the first gate;
   a first diode, wherein a first end of the first diode is electrically connected to the second source/drain, and a second end of the first diode receives an inverted clock pulse signal;
   a first capacitor electrically connected to the first diode in parallel;
   a second diode, wherein a first end of the second diode is electrically connected to the fourth source/drain, and a second end of the second diode receives a clock pulse signal;
   a second capacitor electrically connected to the second diode in parallel;
   a second level shifter unit, comprising:
   a third transistor comprising a third gate, a fifth source/drain and a sixth source/drain, wherein the third gate is electrically connected to the second gate, and the fifth source/drain is electrically connected to the first voltage;
   a third diode, wherein a first end of the third diode is electrically connected to the sixth source/drain, and a second end of the third diode is electrically connected to a second voltage;
   a fourth transistor comprising a fourth gate, a seventh source/drain and a eighth source/drain, wherein the fourth gate is electrically connected to the second gate, and the seventh source/drain is electrically connected to the first voltage; and
   a fifth transistor comprising a fifth gate, a ninth source/drain and a tenth source/drain, wherein the fifth gate is electrically connected to the sixth source/drain, the ninth source/drain is electrically connected to the eighth source/drain, and the tenth source/drain is electrically connected to the second voltage;
   wherein the ninth source/drain outputs a first level adjusted clock pulse signal corresponding to the clock pulse signal.

2. The level shifter circuit according to claim 1, further comprising an output unit comprising:
   a fourth diode having a first end electrically connected to the eighth source/drain;
   a sixth transistor comprising a sixth gate, an eleventh source/drain and a twelfth source/drain, wherein the sixth gate is electrically connected to the second gate, the eleventh source/drain is electrically connected to the first voltage, and the twelfth source/drain is electrically connected to a second end of the fourth diode;

a seventh transistor comprising a seventh gate, a thirteenth source/drain and a fourteenth source/drain, wherein the seventh gate is electrically connected to the second gate, and the thirteenth source/drain is electrically connected to the first voltage;

an eighth transistor comprising an eighth gate, a fifteenth source/drain and a sixteenth source/drain, wherein the eighth gate is electrically connected to the second end of the fourth diode, the fifteenth source/drain is electrically connected to the fourteenth source/drain, and the sixteenth source/drain is electrically connected to the second voltage;

wherein the fifteenth source/drain outputs a second level adjusted clock pulse signal corresponding to the first level adjusted clock pulse signal.

3. The level shifter circuit according to claim 2, wherein the first diode to the fourth diode are respectively implemented by a tenth transistor, an eleventh transistor, a twelfth transistor and a thirteenth transistor, the first capacitor and the second capacitor are respectively implemented by a fourteenth transistor and a fifteenth transistor, in the fourteenth transistor and the fifteenth transistor, the source is electrically connected to the drain, the gate of the fourteenth transistor is electrically connected to the gate of the tenth transistor, and the gate of the fifteenth transistor is electrically connected to the gate of the eleventh transistor.

4. The level shifter circuit according to claim 3, wherein the first transistor to the fifteenth transistor are implemented by a P-type metal oxide semiconductor (PMOS) transistor.

5. The level shifter circuit according to claim 4, wherein in the tenth transistor to the thirteenth transistor, the gate is electrically connected to the drain, the drain of the tenth transistor receives an inverted clock pulse signal, the drain of the eleventh transistor receives a clock pulse signal, the drain of the twelfth transistor is electrically connected to the second voltage, and the drain of the thirteenth transistor is electrically connected to the eighth source/drain.

6. The level shifter circuit according to claim 4, wherein the first voltage is a high voltage, the second voltage is a low voltage, the high voltage is larger than the high level voltage of the clock pulse signal, and the low voltage is lower than the low level voltage of the clock pulse signal.

7. The level shifter circuit according to claim 3, wherein the first transistor to the fifteenth transistor are implemented by an N-type metal oxide semiconductor (NMOS) transistor.

8. The level shifter circuit according to claim 7, wherein in the tenth transistor to the thirteenth transistor, the gate is electrically connected to the drain, the drain of the tenth transistor receives an inverted clock pulse signal, the drain of the eleventh transistor receives a clock pulse signal, the drain of the twelfth transistor is electrically connected to the second voltage, the drain of the thirteenth transistor is electrically connected to the eighth source/drain.

9. The level shifter circuit according to claim 7, wherein the first voltage is a low voltage, the second voltage is a high voltage, the high voltage is larger than the high level voltage of the clock pulse signal, and the low voltage is lower than the low level voltage of the clock pulse signal.

\* \* \* \* \*